SWITCHING CIRCUITS USING CONSTANT CURRENT SOURCE

Filed Feb. 17, 1958

INVENTOR

ROBERT A. HENLE

BY

Alvin J. Riddles

ATTORNEY 2,990,479

SWITCHING CIRCUITS USING CONSTANT CURRENT SOURCE

Robert A. Henle, Hyde Park, N.Y., assignor to International Business Machines Corporation, New York, N.Y., a corporation of New York Filed Feb. 17, 1958, Ser. No. 715,538
7 Claims. (Cl. 307—88.5)

This invention relates to transistor switching circuitry and in particular to transistor switching circuitry operating in the class A type of circuit operation and which provides the complement of the logical function achieved through the use of the circuit.

It has become established in the art that the speed of operation of a transistor circuit is related to the amount of charging and discharging of distributed capacitance associated with the circuit and to the degree of cut-off and saturation experienced by the transistor in operation. The distributed capacitance has been found to have the greatest effect when wide changes of current levels take place in the circuit and is most pronounced when current flow through the circuit decreases from an established value to zero when the circuit is shut off. Switching circuits have been found to exhibit the most favorable switching characteristics when the operation of the circuit is confined to a portion of the output characteristic wherein the cut-off and saturation regions of the output characteristic are avoided.

What has been discovered is a principle of switching circuitry involving two alternate current paths, each of which is supplied with a switching current source and a hold current source such that an active element in each of the alternate current paths is operated in what is known in the art as the class A amplifier type operation wherein a single capacitor element connected between the inputs to the two alternate current paths serves to assist in switching a signal current from one path to the other and the circuit is independent of any emitter to base breakdown voltage of a transistor used therein.

A primary object of this invention is to provide an improved principle for the design of switching circuits.

An object of this invention is to provide an improved high-speed transistor switching circuit.

Another object of this invention is to provide a transistor switching circuit which operates on relatively small signals.

Still another object of this invention is to provide a transistor switching circuit wherein a single reactive element is capable of assisting both turn off and turn on of the circuit.

A related object of this invention is to provide a non-return to zero type complemented switching circuit.

Another related object is to provide a switching circuit operating above the cut-off and below the saturation condition.

Another related object is to provide a transistor switching circuit that is independent of the emitter to base break-down voltage of the transistors employed therein.

Other objects of the invention will be pointed out in the following description and claims and illustrated in the accompanying drawings, which disclose, by way of example, the principle of the invention and the best mode, which has been contemplated, of applying that principle.

Figure 1:
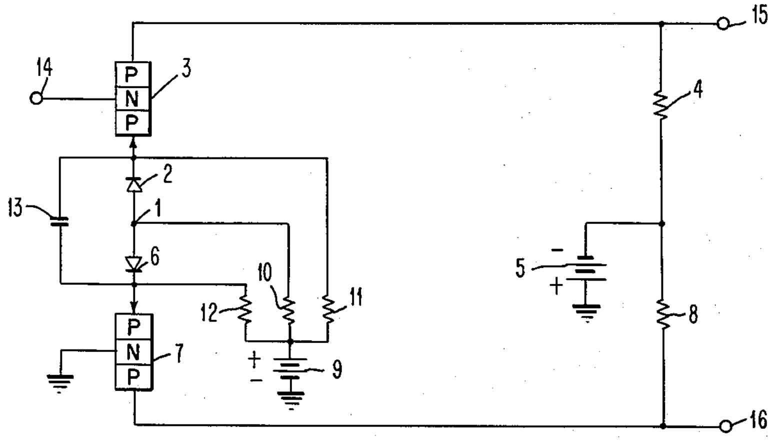
FIG. 1 is a transistor switching circuit illustrating the principles of this invention.

Referring now to FIG. 1, a transistor circuit is shown illustrating the principle of the switching circuits of this invention. The transistor circuit in FIG. 1 comprises a common point 1 and a first current path including a diode 2 and the emitter to collector path of a transistor 3 shown in this embodiment as a PNP type junction transistor. A load impedance 4 is connected in series with the collector of the transistor 3 to the negative terminal of a power source 5. An alternate current path from point 1 comprises a diode 6, the emitter to collector path of a transistor 7, shown in this embodiment as a PNP type junction transistor, and a load impedance 8 connected, in series, between the common point 1 and battery 5. The positive terminal of battery 5 is connected to a reference potential. The base of transistor 7 is shown connected to the reference potential. Three sources of constant current are shown and provide current for the two alternate paths. The first of these is illustrated as comprising battery 9 and resistor 10, in series, between reference potential and the common point 1; the second constant current source is illustrated as resistor 11 connected between the positive terminal of battery 9 and the emitter of transistor 3 and the third constant current source is illustrated as resistor 12 connected between the positive terminal of battery 9 and the emitter of transistor 7. A reactive element 13, shown here as a capacitor, is connected between the emitter of transistor 3 and the emitter of transistor 7. Input signals may be impressed at terminal 14 and the output signal describing the logical function achieved in response to the input may be sensed at output terminal 15 and its complement at output terminal 16.

In order to aid in understanding and practicing this invention, the following set of circuit values is provided for the circuit of FIG. 1, it being understood that a wide range of such values are possible and that the particular ones given here are for purposes of illustration only.

| | |
|---|---|
| Transistors 3 and 7 | PNP type junction transistors 0.95 with 0.3 volt emitter to base voltage drop with 4 milliamperes collector current. |
| Battery 9 | 30 volts. |
| Resistor 10 | 10,000 ohms. |
| Resistors 11 and 12 | 30,000 ohms. |
| Resistors 4 and 8 | 400 ohms. |
| Battery 5 | 3 volts. |
| Diodes 2 and 6 | Germanium junction, back resistance 5 megohms, forward voltage drop 0.3 volt at 4 milliamperes Sylvania 1N51 or equivalent. |
| Capacitor 13 | 5 micromicrofarads. |

It will be apparent to one skilled in the art that the above embodiment may readily be converted to a circuit handling opposite polarity input pulses through the use of NPN type transistors and the appropriate reversal of battery and diode connections as may be accomplished readily by one skilled in the art.

Figure 2:
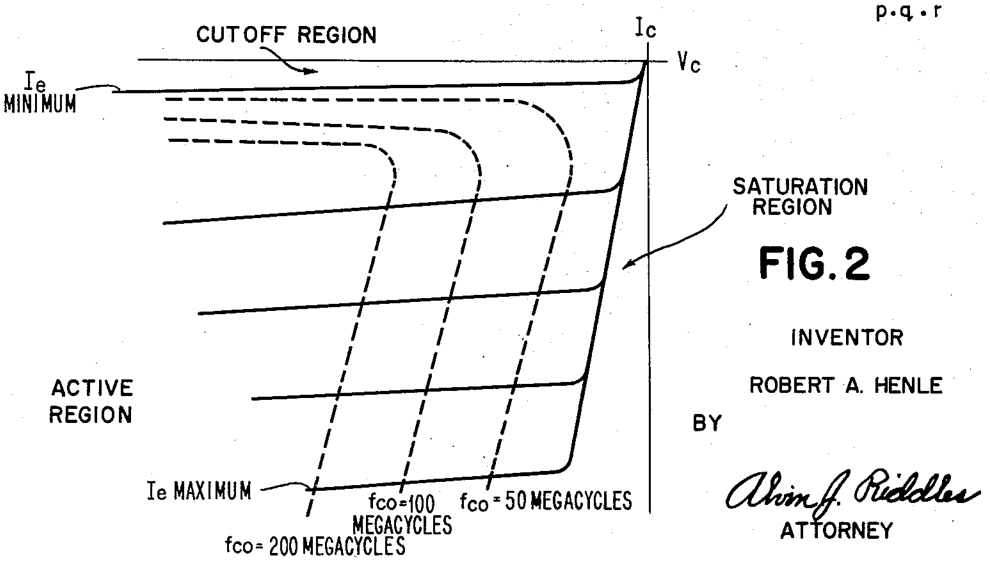
FIG. 2 is a family of output characteristic curves of a transistor connected as shown in FIG. 1.

Referring now to FIG. 1 and the above table of values, the circuit is constructed such that a constant current arbitrarily selected at a value of 3 milliamperes is delivered to the common point 1 to flow through one of two alternate paths comprising transistors 3 or 7 to the negative terminal of battery 5. At the same time individual constant current sources for each particular one of the alternate branches are provided. In the case of transistor 3, constant current is provided through resistor 11, and, in the case of transistor 7, constant current is provided through resistor 12. Each of the constant current sources is connected directly to the emitter of the transistors 3 and 7 in the alternate paths and is selected to deliver a minimum value of current. This minimum value has been selected to be one-third the quantity of current of that provided to the common point 1. The output characteristic of a transistor such as transistor 3 or 7, when operated in this type of circuitry, is shown in FIG. 2. The collector current is plotted as the ordinate and collector voltage is plotted as the abscissa. The active region of the transistor operation is designated as the area between the emitter current line $I_e$ minimum which serves as the boundary of a cut-off region operation and the $I_e$ maximum which defines the boundary of the saturation region of the transistor. The constant current provided to each transistor through the constant current generators comprising battery 9 and resistor 11 for transistor 3, and battery 9 and resistor 12 for transistor 7 operate to prevent the emitter current supply to each of these transistors from permitting the collector current value to drop below the value designated as the boundary of the cut-off region, and, at the same time the combination of the constant current supplied directly to the emitter of the particular transistor 3 or 7 in conduction, operates to prevent the transistor that is conducting from entering the saturation region as defined by the $I_e$ maximum line in the curve of FIG. 2. The values of constant cut-off frequency for the circuit of FIG. 1 shown superimposed in the curve of FIG. 2 as dotted lines. It will be noted that the cut-off frequency improves in the higher voltage, higher current regions as may be seen from the wide spacing of the dotted constant cut-off frequency lines near saturation. As a result of the switching technique of this invention, it may be seen that the active elements, transistors 3 and 7 are never cut-off nor saturated and, therefore, they remain in their most favorable region for rapid response, and since the emitter to base junctions of the transistors 3 and 7 are never reverse biased the circuit is completely independent of the emitter to base breakdown voltage limitation in transistors.

When the base of transistor 3 is at the one signal level, in other words, in a condition wherein a positive signal, for example of +.3 volt, is applied to the input terminal 14, the emitter of transistor 3 will be +0.6 volt, the common point 1 will be +0.6 volt and the emitter of transistor 7 will be at +0.3 volt. Under these conditions, since the base of transistor 7 is connected to reference potential, transistor 7 will be conducting a current of 4 milliamperes made up of the 3 milliamperes supplied to common point 1 through resistor 10 and 1 milliampere supplied directly to the emitter through resistor 12. At the same time, transistor 3 is conducting the 1 milliampere supplied directly to the emitter through resistor 11 which is a sufficient minimum to keep it out of the cut-off region, as shown in FIG. 2.

As an input signal is now removed from the base of transistor 3, by causing the potential level at the input terminal 14 to drop for example to the signal level of −0.3 volt, the following conditions prevail. The forward emitter to base potential drop, internal to transistor 3 cancels out the value of the input signal and the potential level at the emitter of transistor 3 moves to 0.0 volt. The potential level at the common point 1 shifts to +0.3 volt and the potential level at the emitter of transistor 7 moves to +0.3 volt. Under these conditions, transistor 3 will now begin to conduct 4 milliamperes made up of the 3 milliamperes delivered through resistor 10 to common point 1 and the 1 milliampere delivered through resistor 11 directly to the emitter of transistor 3. Transistor 7 now receives only the minimum 1 milliampere through resistor 12 which operates to keep it out of the cut-off region. Under these switching conditions, capacitor 13 having been connected between the two emitters which were at different potentials operates to deliver a charge into the emitter of the transitor whose current is increasing at switching time so as to aid in turning on. In the above discussion the potential values should be considered approximate due to the variations in component tolerances, for example, the variation in internal impedance of the semiconductor elements.

The same current conditions, above described, will prevail if the input signal excursion at input terminal 14 exceeds the values recited in the above table since the constant current sources limit all operating conditions so that the input signal excursion is not critical with respect to the operation of the circuit. It should be noted that transistors 3 and 7 are never in a zero current condition and that they are prevented from entering the cut-off condition, since the constant current delivered directly to their emitters provide the necessary minimum emitter current and thereby to approach class A amplifier type operation. The two diodes 2 and 6 serve the purpose of permitting a potential shift at common point 1 without, at the same time, serving as a current drain on the emitter of the transistor which is not heavily conducting.

Figure 3:
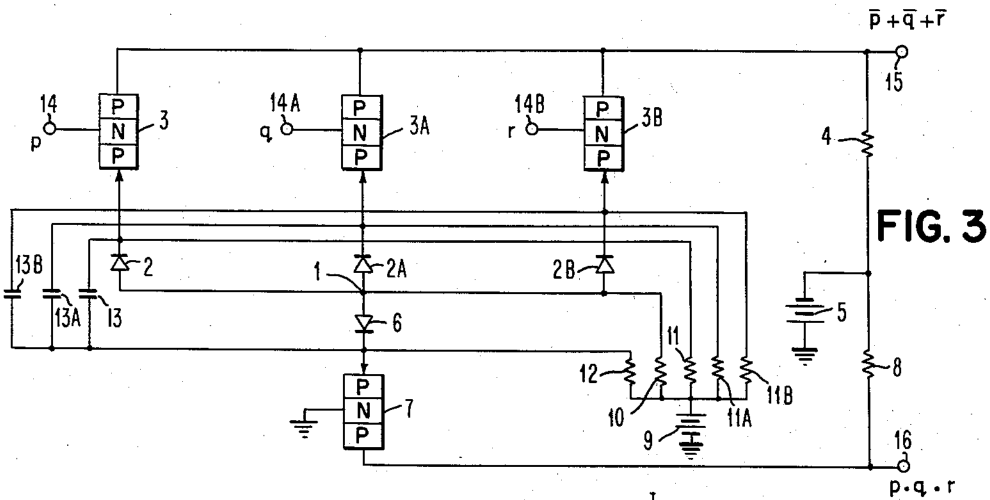
FIG. 3 is an illustration of a transistor and circuit illustrating the use of this invention in a logical circuit application.

The above described switching principle may be connected into a logical arrangement as illustrated by the logical circuit of FIG. 3 wherein like elements have been given consistent reference numbers with FIG. 1.

Referring now to FIG. 3, a plurality of constant current sources illustrated as battery 9 having its negative terminal connected to reference potential and series resistors as follows: Resistor 10 supplies constant current to a common point 1, resistor 12 supplies minimum constant current directly to the emitter of transistor 7 for one of the alternate current paths and resistors 11, 11A and 11B each provide minimum constant current respectively directly to the emitters of transistors 3, 3A and 3B which, in parallel, comprise the second alternate current path. Diode 6 serves to prevent emitter current to transistor 7 from being drawn to transistors 3, 3A and 3B when transistor 7 is not heavily conducting and similarly diodes 2, 2A and 2B serve to prevent emitter current from being drawn on transistors 3, 3A and 3B when transistor 7 is heavily conducting. Transistor 7 is connected to battery 5 through load resistor 8 and transistors 3, 3A and 3B in parallel are connected through load resistor 4 to battery 5. Input terminal 14 and output terminals 15 and 16 are provided, as previously described in connection with FIG. 1 and capacitive elements 13, 13A and 13B are connected for switching acceleration purposes as described in connection with FIG. 1.

The above logical circuit is capable of providing, at the output terminal 15, in response to input variables *p*, *q* and *r* introduced respectively at the input terminals 14, 14A and 14B, the logical function representing the "Not Or" function of *p*, *q*, *r* symbolized $\overline{p}+\overline{q}+\overline{r}$. Simultaneously at output terminal 16, the complement of the logical function realized at the output terminal 15 is achieved. This is the "And" function of the presence of *p* and *q* and *r* symbolized $p \cdot q \cdot r$.

In the circuit configuration of FIG. 3, the circuit is designed along the lines described above in connection with FIG. 1 such that the constant current from battery 9 through resistor 10 delivered to the common point 1 is several orders of magnitude greater than the constant currents delivered to the emitters of transistors 7, 3, 3A and 3B as considered in connection with FIG. 1. Assuming again, for illustration, that 3 milliamperes is delivered to point 1 and that 1 milliampere each is delivered to the emitters of the switching transistors, it will then be apparent that the off or low signal condition at output terminal 15 will be the potential level across resistor 4 developed by 3 milliamperes flowing through resistor 4 made up of the three constant currents supplied directly to the emitters of transistors 3, 3A and 3B. In the condition wherein transistors 3 or 3A or 3B is turned on due to the presence of an input variable of *p*, *q* or *r*. The signal level at terminal 15 will then be the potential developed across resistor 4 as a result of 6 milliamperes made up of the 3 milliamperes supplied directly to the three emitters and the 3 milliamperes switched from common point 1.

It will be apparent to one skilled in the art that an adjustment of magnitude of resistor 4 or of any other compatible load resistor employed with this type of switching circuitry may readily be performed to cause the signal level swing at terminal 15 to be compatible with the input of other switching circuitry. In the case of the condition wherein *p*, *q* and *r* are each present, the current flowing through resistor 8 changes from 1 milliampere, which had been supplied directly to the emitter of transistor 7 to4 milliamperes made up of the minimum 1 milliampere and the 3 milliamperes switched from common point 1 so that the low and high signal levels at terminal 16 describing the presence or absence of the logical function *p* and *q* and *r* is determined by the value of these two currents flowing through resistor 8.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A transistor switching circuit comprising, in combination, a common point, a first source of constant current having a first magnitude supplying constant current to said common point, a first diode having its cathode connected to said first common point, a first transistor having its emitter connected to the anode of said first diode, a source of power having one terminal thereof connected to a reference potential, a first load impedance having one terminal thereof connected to the remaining terminal of said power source and having the remaining terminal thereof connected to the collector of said first transistor, a second diode having the cathode thereof connected to said common point, a second transistor having the emitter thereof connected to the anode of said second diode, a second load impedance having one terminal thereof connected to the said remaining terminal of said power source and having the remaining terminal thereof connected to the collector of said second transistor, means connecting the base of said second transistor to reference potential, a second source of constant current having a magnitude less than said first source directly connected to the emitter of said first transistor, a third source of constant current having a magnitude less than said first source of constant current directly connected to the emitter of said second transistor, a reactive element directly connected between the emitter of said first transistor and the emitter of said second transistor.

2. The switching circuit of claim 1 wherein said first and said second transistors are of the PNP type.

3. The switching circuit of claim 1 wherein said first and said second type transistors are of the NPN type.

4. A logical circuit comprising, in combination, a common point, a first source of constant current having a first magnitude connected to said common point, a reference potential, a first, a second, a third and a fourth diode, each having the cathode thereof connected to said common point, a first transistor having the emitter thereof connected to the anode of said first diode, a second transistor having the emitter thereof connected to the anode of said second diode, a third transistor having the emitter thereof connected to the anode of said third diode, a source of power having one terminal thereof connected to said reference potential, a first load impedance having one terminal thereof connected to the remaining terminal of said power source and having the remaining terminal thereof connected to the collectors of said first, said second and said third transistors, a fourth transistor having the emitter thereof connected to the anode of said fourth diode, means connecting the base of said fourth transistor to reference potential, a second load impedance having one terminal thereof connected to said remaining terminal of said source of power and having the remaining terminal thereof connected to the collector of said fourth transistor, means supplying constant current of a magnitude less than said first constant current directly to the emitter of each said first, said second, said third and said fourth transistors, a first capacitor connected between the emitter of said first transistor and the emitter of said fourth transistor, a second capacitor connected between the emitter of said second transistor and the emitter of said fourth transistor and a third capacitor connected between the emitter of said third transistor and the emitter of said fourth transistor.

5. A logical circuit of claim 4 wherein said first, said second, said third and said fourth transistors are of the PNP type.

6. A logical circuit of claim 4 wherein said first, said second, said third and said fourth transistors are of the NPN type.

7. A logical circuit comprising in combination; a common point, a reference potential, at least first and second alternate current paths connected between said common point and said reference potential, each of said current paths comprising at least one branch, each branch comprising an asymmetric impedance having at least an input and an output electrode and the emitter to collector current path of a transistor the output electrode of said asymmetric impedance being connected to the emitter electrode of the transistor, each asymmetric impedance having the input electrode thereof connected to said common point, a first magnitude constant current source connected to said common point, said first magnitude being less than a current magnitude sufficient to saturate a transistor in each said current path, a second magnitude constant current source directly connected to the emitter electrode of the transistor in each said current path, said second magnitude being less than said first magnitude and sufficient to operate the transistor in each said current path above a cut-off current value, a single reactive element directly connected between the emitter of the transistor in one of said alternate current paths and the emitter of the transistor in each of the other of said alternate current paths, and signal input means connected to the base electrode of at least one transistor.

References Cited in the file of this patent

UNITED STATES PATENTS

| | | |
|---|---|---|
| 2,535,377 | Titterton | Dec. 26, 1950 |
| 2,665,845 | Trent | Jan. 12, 1954 |
| 2,825,821 | Logue | Mar. 4, 1958 |
| 2,876,365 | Slusser | Mar. 3, 1959 |

OTHER REFERENCES

IRE Transactions-Circuit Theory, March 1956, "The Emitter-Coupled Differential Amplifier," by D. W. Slaughter, pages 51–53.